United States Patent
Lee et al.

(10) Patent No.: US 8,054,308 B2
(45) Date of Patent: Nov. 8, 2011

(54) LIQUID CRYSTAL DISPLAY DEVICE AND DRIVING METHOD THEREOF

(75) Inventors: Sang Hoon Lee, Daegu (KR); Hwa Young Kim, Suwon-si (KR); Jong Woo Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 594 days.

(21) Appl. No.: 12/271,741

(22) Filed: Nov. 14, 2008

(65) Prior Publication Data
US 2009/0160836 A1    Jun. 25, 2009

(30) Foreign Application Priority Data
Dec. 21, 2007   (KR) .................. 10-2007-0135840

(51) Int. Cl.
*G06F 3/038* (2006.01)

(52) U.S. Cl. ........................ 345/213; 345/100

(58) Field of Classification Search .................. 345/100, 345/213, 204
See application file for complete search history.

(56) References Cited

U.S. PATENT DOCUMENTS

| | | | |
|---|---|---|---|
| 7,176,874 B2 * | 2/2007 | Furukoshi | 345/99 |
| 7,224,340 B2 * | 5/2007 | Pai et al. | 345/99 |
| 7,948,466 B2 * | 5/2011 | Lee | 345/100 |
| 2005/0083290 A1 * | 4/2005 | Katagawa et al. | 345/100 |

* cited by examiner

*Primary Examiner* — Kevin M Nguyen
*Assistant Examiner* — Sepideh Ghafari
(74) *Attorney, Agent, or Firm* — Birch, Stewart, Kolasch & Birch, LLP

(57) ABSTRACT

A driving method of an LCD device adapted to improve the quality of pictures is disclosed. The driving method includes: deriving a frame detection signal from a data enable signal and a data clock signal; simultaneously deriving a start signal and a first gate clock signal from the frame detection signal and the data clock signal; and deriving a second gate clock signal from the first gate clock signal and the data clock signal. The first gate clock signal is identical with the start signal in a start time point of enable interval.

6 Claims, 6 Drawing Sheets

LIQUID CRYSTAL DISPLAY DEVICE AND DRIVING METHOD THEREOF

CROSS-REFERENCE TO RELATED APPLICATION

This application claims priority under 35 U.S.C. 119 to Korean Patent Application No. 10-2007-0135840, filed on Dec. 21, 2007, which is hereby incorporated by reference in its entirety.

BACKGROUND

1. Field of the Disclosure

This disclosure relates to a liquid crystal display device, and more particularly, to a liquid crystal display device adapted to improve picture quality and a driving method thereof.

2. Description of the Related Art

As the information society spreads, flat display devices capable of displaying information have been widely developed. These flat display devices include liquid crystal display (LCD) devices, organic electro-luminescence display devices, plasma display devices, and field emission display devices. Among the above devices, LCD devices have advantages in that they can be light and small and can implement a low power consumption and a full color scheme. Accordingly, LCD devices have been widely used for mobile phones, navigation systems, portable computers, televisions and so on.

FIG. 1 is a block diagram showing an LCD device of related art, FIG. 2 is a detailed block diagram showing a gate driver in FIG. 1, and FIG. 3 is a circuitry diagram showing a first shift register in FIG. 2.

As shown in FIG. 1, the related art LCD device includes a liquid crystal panel 130, a gate driver 110, a data driver 120, and a timing controller 100. The liquid crystal panel 130 displays the pictures. The gate driver 110 drives the liquid crystal panel 130 by lines. The data driver 120 applies data voltages to the liquid crystal panel 130 by lines. The timing controller 100 controls the gate driver 110 and the data driver 120.

In order to control the gate driver 110 and the data driver 120, the timing controller 100 generates control signals. For example, the timing controller 100 generates a start signal Vst and first to fourth gate clock signals GCLK1 to GCLK4 to control the gate driver 110. The timing controller 100 also generates a source start pulse SSP, a source shift clock SSC, a source output enable signal SOE, a polarity control signal POL, and so on.

The gate driver 110 is directly formed on the liquid crystal panel 130. Such a structure panel is called a Gate-in-Panel. Also, the gate driver 110 includes a plurality of stages ST1 to STn, as shown in FIG. 2. The stages ST1 to STn are connected to one another to form a cascade configuration. Each of the stages ST1 to STn receives an output signal from a previous stage and the three gate clock signals among the first to fourth gate clock signals GCLK1 to GCLK4 which are sequentially applied. The first stage ST1 independently inputs the start signal Vst instead of the previous stage's output signal, because the previous stage did not exist.

Each of the stage ST1 to STn uses the previous stage's output signal and the three gate clock signals of the first to fourth gate clock signals GCLK1 to GCLK4 and generates an output signal Vg1 to Vgn. The output signals Vg1 to Vgn generated in the stages ST1 to STn are applied to gate lines GL1 to GLn on the liquid crystal panel 130, respectively.

Such stages ST1 to STn are identical with one another in their internal circuit configuration. Accordingly, for convenience of explanation, the circuit configuration of first stage ST1 will be now described.

Referring to FIG. 3, the fourth gate clock signal GCLK4 and the start signal Vst are applied to the first stage ST1. The first stage ST1 includes a first control portion 112 responsive to the start signal Vst and the fourth gate clock signal GCLK4, controlling a first node Q; a second control portion 114 responsive to the third gate clock signal GCLK3 and the start signal Vst, controlling a second node QB; and an output portion 116 responsive to voltages on the first and second nodes Q and QB, selectively outputting the first gate clock signal GCLK1 and a first supply voltage VSS.

The fourth gate clock signal GCLK4 turns on a second transistor T2 so that the start signal Vst is charged into the first node Q through a first transistor T1 and the second transistor T2, during a first interval. Then, a sixth transistor T6 is slowly turned on by the voltage on the first node Q. A fifth transistor T5 is also turned on so that the first supply voltage VSS is charged to the second node QB. The voltage VSS on the second node QB turns off third and seventh transistors T3 and T7. Accordingly, although the sixth transistor T6 is slowly turned on, the first gate line GL1 maintains a low level state due to the first gate clock signal GCLK1 of low level, during the first interval.

For a second interval, the start signal Vst and the first to fourth gate clock signal GCLK1 to GCLK4 are not applied. The status of the first stage ST1 in the first interval continues even-in spite of for the second interval.

The first gate clock signal GCLK1 is applied to a source terminal of the sixth transistor T6 during a third interval. Then, a bootstrapping phenomenon is caused by an internal capacitor (or a parasitic capacitor) Cgs between the source and gate terminals of the sixth transistor T6, thereby increasing the voltage on the first node Q connected with the gate terminal of the sixth transistor T6. As a result, the sixth transistor T6 is fully or completely turned on so that the first gate clock signal GCLK1 of high level is charged on the first gate line GL1 of the liquid crystal panel 130 via the sixth transistor T6.

For a fourth interval, a second supply voltage VDD is charged to the second node QB through a fourth transistor T4 which is turned on by the third gate clock signal GCLK3. At this time, since the first gate clock signal GCLK1 has the low level, the bootstrapping phenomenon ceases so that the first node Q maintains the previous voltage, i.e., the voltage of the start signal Vst. The voltage on the second node QB turns on the third and seventh transistors T3 and T7, thereby charging the first supply voltage VSS to both of the first node Q and the first gate line GL1 of the liquid crystal panel 130 through each of the third and seventh transistors T3 and T7.

In this manner, the start signal Vst and the first to fourth gate clock signals GCLK1 to GCLK4 should be applied from the timing controller 100 in order to drive the gate driver 110.

However, when the first gate clock signal GCLK1 is compared with the second to fourth gate clock signals GCLK1 to GCLK4 in the high level interval, the first gate clock signal GCLK1 has a relatively short high level interval, as shown in FIG. 4. Accordingly, thin film transistors on the first gate line GL1 each have a relatively short turning-on interval in comparison with those on the other gate lines GL2 to GLn of the liquid crystal panel 130, thereby allowing pixels on the first gate line GL1 to be brighter than those on the other gate lines GL2 to GLn.

As a result, a brightness difference between the pixels of the first gate line GL1 and the pixels of the other gate lines GL2 to GLn is generated, thereby deteriorating the quality of picture.

BRIEF SUMMARY

Accordingly, the present embodiments are directed to an LCD device that substantially obviates one or more of problems due to the limitations and disadvantages of the related art.

An object of the present embodiment is to provide an LCD device that enables the rising edge of a first gate clock signal GCLK1 to be identical with that of a start signal so as to improve the quality of picture, and a driving method thereof.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a driving method of liquid crystal display device includes: deriving a frame detection signal from a data enable signal and a data clock signal; simultaneously deriving a start signal and a first gate clock signal from the frame detection signal and the data clock signal; and deriving a second gate clock signal from the first gate clock signal and the data clock signal. The first gate clock signal is identical with the start signal in a start time point of high level interval.

An LCD device according to another aspect of the present embodiment includes: a frame detector deriving a frame detection signal from a data enable signal and a data clock signal by detecting a blank interval between frames; a start and first gate clock signal generator simultaneously deriving a start signal and a first gate clock signal from the frame detection signal and the data clock signal; and a second gate clock signal generator deriving a second gate signal from the first gate clock signal and the data clock signal, wherein the first gate clock signal is identical with that of the start signal in a start time point of high level interval.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
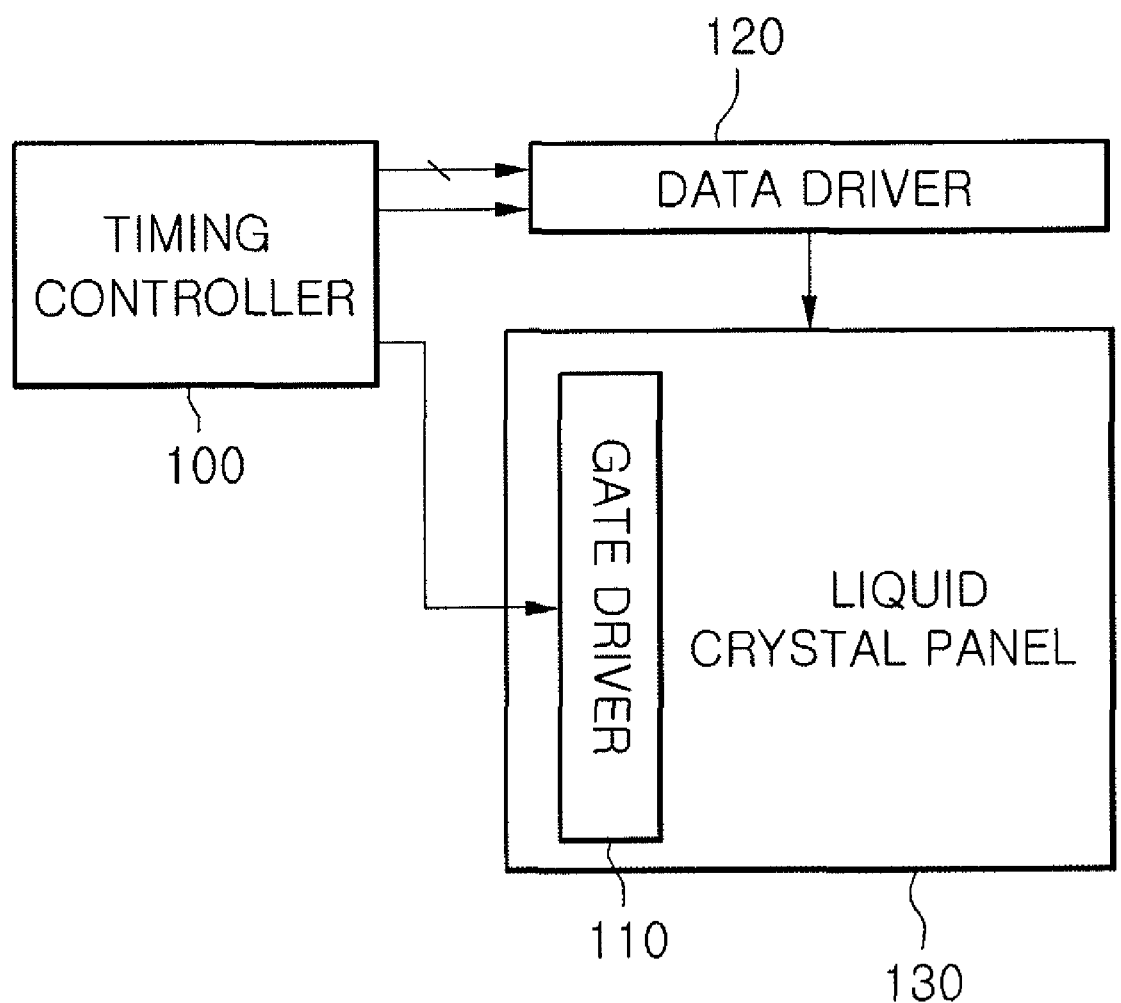
FIG. 1 is a block diagram showing an LCD device of related art.
Figure 2:
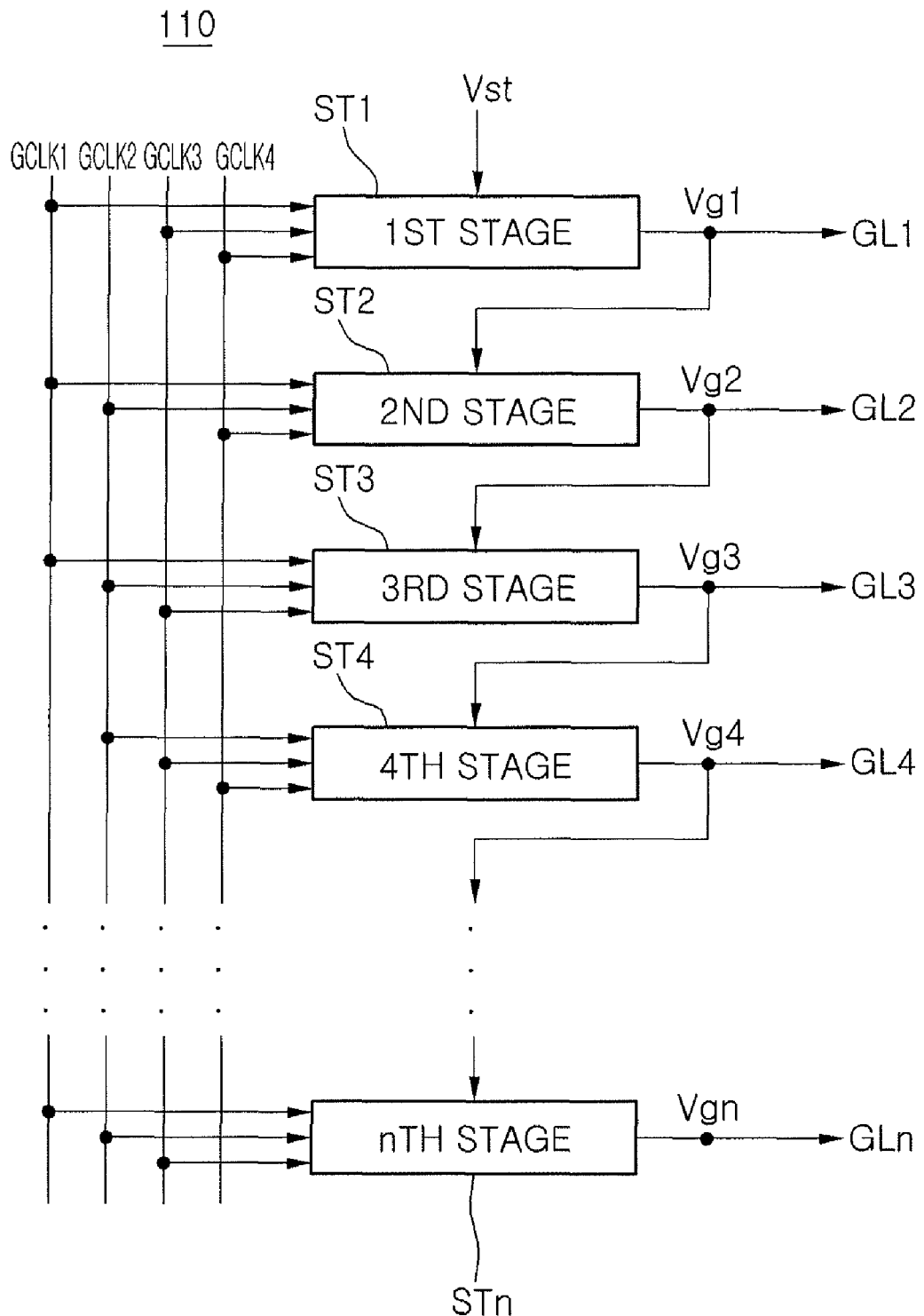
FIG. 2 is a detailed block diagram showing a gate driver in FIG. 1.
Figure 3:
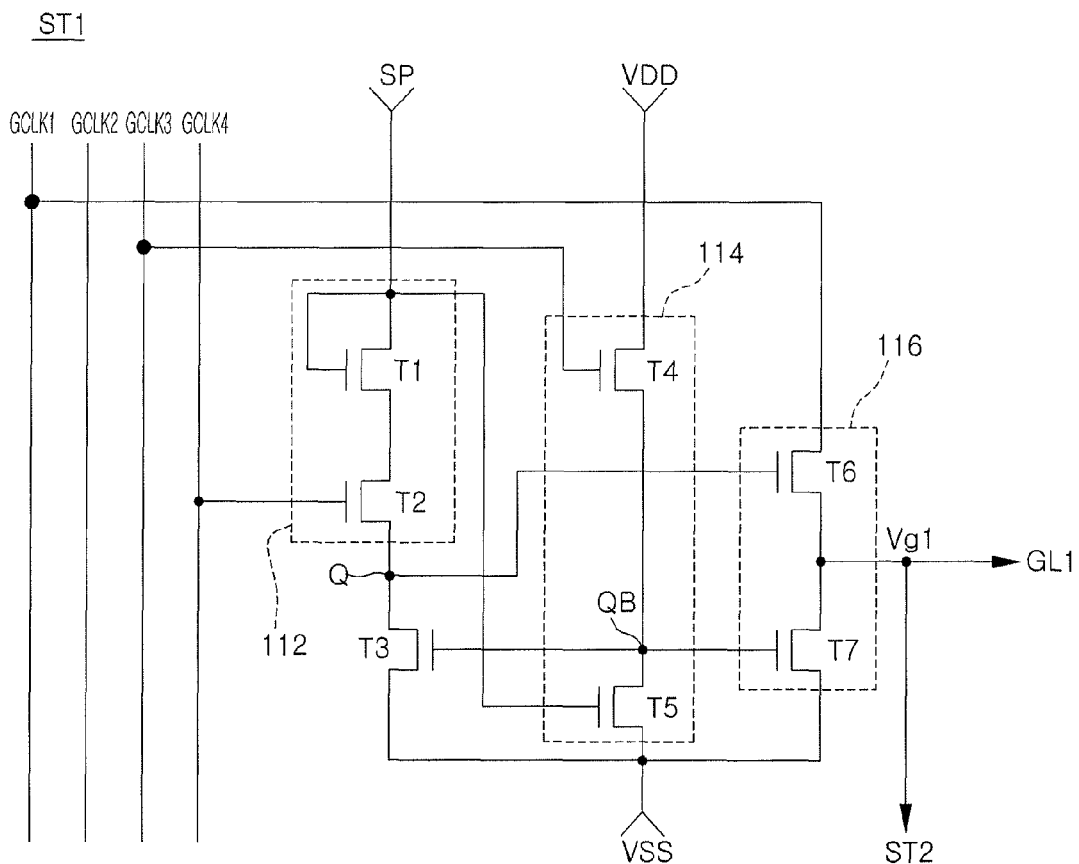
FIG. 3 is a circuitry diagram showing in detail a first stage in FIG. 2.
Figure 4:
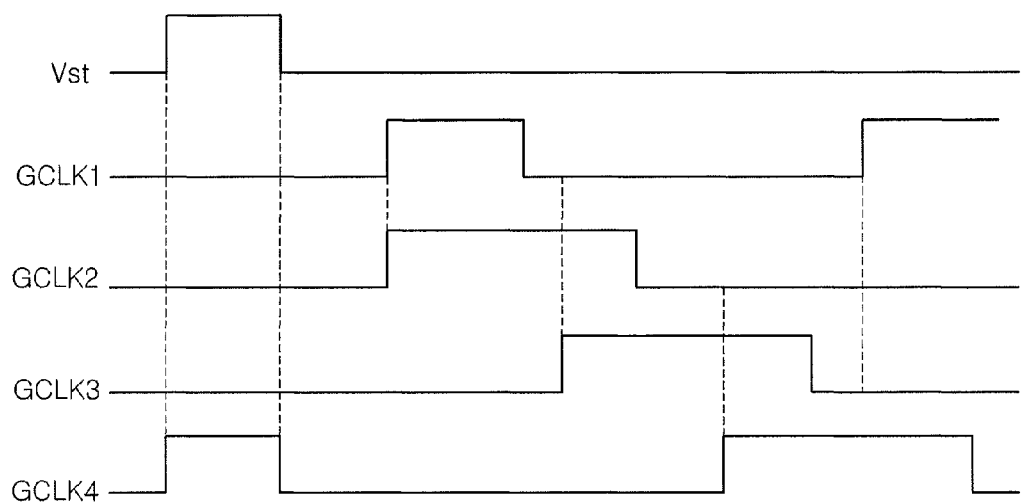
FIG. 4 is a waveform diagram showing control signals generated in a timing controller of FIG. 1.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 5:
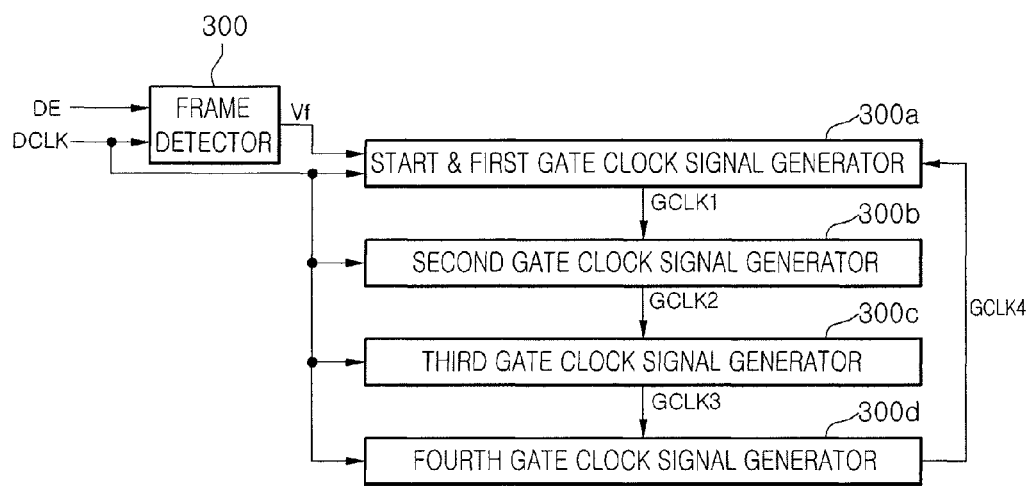
FIG. 5 is a block diagram showing a timing controller of an LCD device according to an embodiment of the present disclosure.

FIG. 5 is a block diagram showing a timing controller of an LCD device according to an embodiment of the present disclosure. Referring to FIG. 5, the timing controller includes a frame detector 300, a start & first gate clock signal generator 300a, and second to fourth gate clock signal generators 300b to 300d.

The frame detector 300 receives a data enable signal DE and a data clock signal DCLK, counts clocks included in the data clock signal DCLK, and detects a blank interval of the data enable signal DE on the basis of the counted clock value. The data enable signal DE includes the blank interval (i.e., a vertical blank interval) between frame intervals. Also, the data enable signal DE further includes horizontal intervals of high level periodically arranged within one frame interval. In accordance therewith, the frame detector 300 counts the clocks included in the data clock signal DCLK and determines an arbitrary interval in which the data enable signal DE continuously maintains the low level until the counted clock value reaches to a constant value, as the blank interval. The frame detector 300 also detects a rising edge of the data enable signal DE, which is changed from the low level to the high level and corresponds to the end position of the determined blank interval, on the basis of the determined blank interval. Furthermore, the frame detector 300 generates the frame detection signal Vf which is synchronized with the detected rising edge and is equal to the clock of the data clock signal DCLK in width. Herein, the width of the frame detection signal Vf can be larger or smaller than one clock of the data clock signal DCLK.

The start & first gate clock signal generator 300a receives the frame detection signal Vf from the frame detector 300 and the data clock signal DCLK. This start & first gate clock signal generator 300a derives a start signal Vst and a first gate clock signal GCLK1 from the frame detection signal Vf and the data clock signal DCLK. The start signal Vst and the first gate clock signal GCLK1 are equal to each other in a start time point of high level, but are different from each other in an end time point of high level. The high level intervals of the start and first gate clock signals Vst and GCLK1 may be established by the data clock signal DCLK in lengths different from each other. These start and first gate clock signals Vst and GCLK1 are applied to the second gate clock signal generator 300b.

The second gate clock signal generator 300b derives a second gate clock signal GCLK2 from the data clock signal DCLK and the first gate clock signal GCLK1. The second gate clock signal GCLK2 has a high level interval (i.e., an enable interval) equal to the one of the first gate clock signal GCLK1, but that can be delayed from the first gate clock signal GCLK1 by a fixed period. The fixed shift period can be changed in accordance with the specifications of a display device. Such a second gate clock signal GCLK2 is applied to the third gate clock signal generator 300c.

The third gate clock signal generator 300c also derives a third gate clock signal GCLK3 from the second gate clock signal GCLK2 and the data clock signal DCLK. The third gate clock signal GCLK3 has a high level interval equal to the one of the second gate clock signal GCLK2, but that can be delayed from the second gate clock signal GCLK2 by the fixed period. The fixed shift period can be changed in accordance with the specifications of a display device. Such a third gate clock signal GCLK3 is applied to the fourth gate clock signal generator 300d.

Similarly, the fourth gate clock signal generator 300d derives a fourth gate clock signal GCLK4 from the third gate clock signal GCLK3 and the data clock signal DCLK. The fourth gate clock signal GCLK4 has a high level interval equal to the one of the third gate clock signal GCLK3, but that can be delayed from the third gate clock signal GCLK3 by the fixed period. The fixed shift period can be changed in accordance with the specifications of a display device.

This fourth gate clock signal GCLK4 is applied to the start and first gate clock signal generator 300a so that it derives the start and first gate clock signals Vst and GCLK1 from the fourth gate clock signal GCLK4 and the data clock signal DCLK and applies to the first gate clock signal GCLK1 to the second gate clock signal generator 300b.

Figure 6:
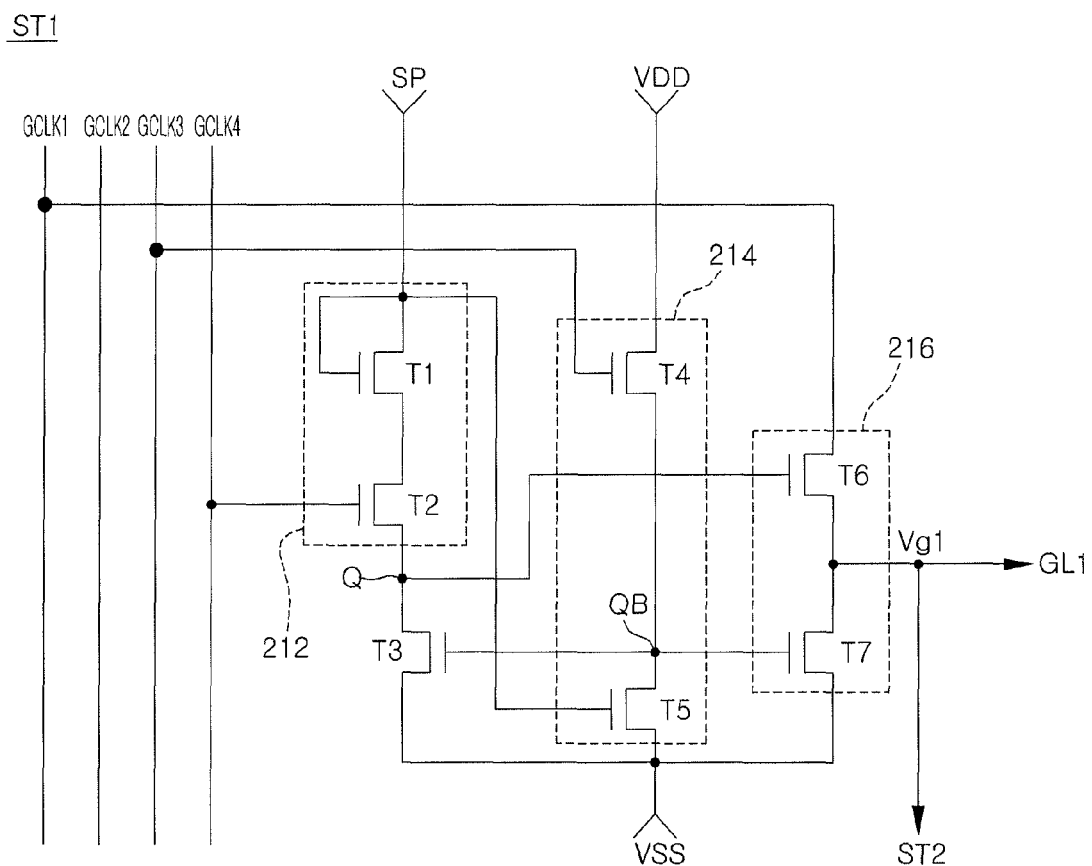
FIG. 6 is a circuitry diagram showing a first stage of a gate driver according to an embodiment of the present disclosure.
Figure 7:
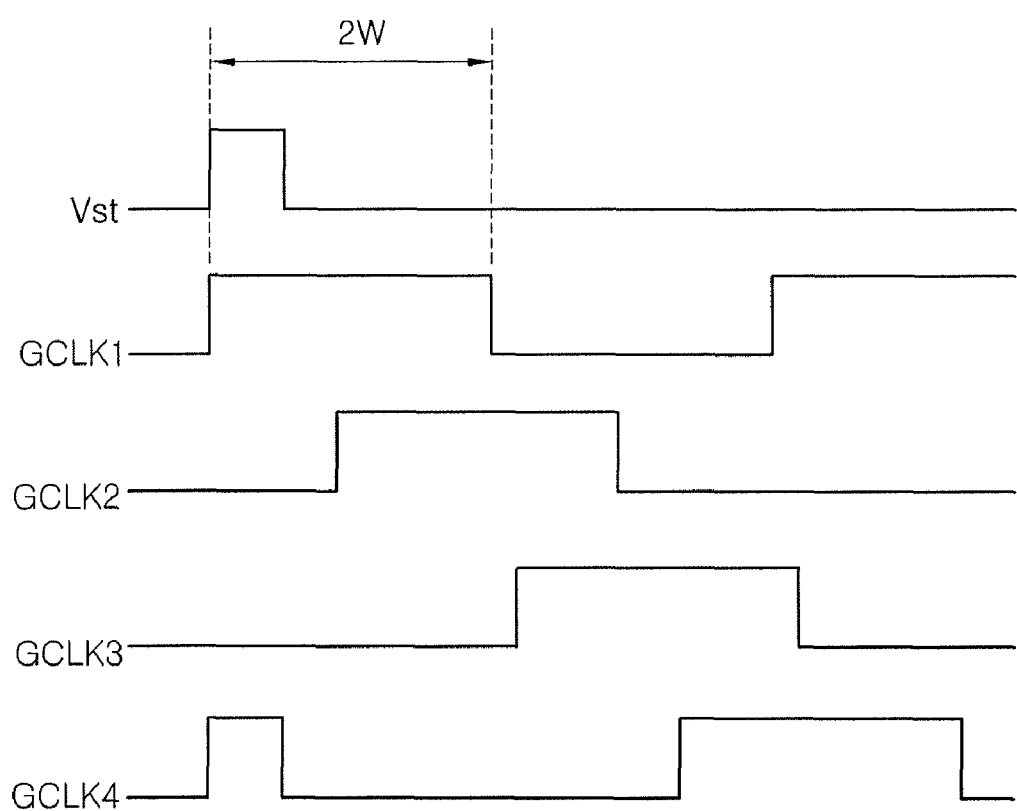
FIG. 7 is a waveform diagram explaining control signals generated in a timing controller of FIG. 5.

FIG. 6 is a circuitry diagram showing a first stage which is included in a gate driver according to an embodiment of the present disclosure. FIG. 7 is a waveform diagram explaining control signals generated in the timing controller of FIG. 5. The gate driver according to the embodiment of the present invention includes a plurality of stages which each have a configuration as shown in FIG. 6. As the plural stages are identical with one another in their internal circuit configuration, the circuit configuration of first stage ST1 will be now described by way of example, for convenience of explanation.

Referring to FIG. 6, the first stage ST1 includes: a first control portion 212, responsive to the start signal Vst and the fourth gate clock signal GCLK4, controlling a first node Q; a second control portion 214, responsive to the third gate clock signal GCLK3 and the start signal Vst, controlling a second node QB; and an output portion 216, responsive to voltages on the first and second nodes Q and QB, selectively outputting the first gate clock signal GCLK1 and a first supply voltage VSS.

The fourth gate clock signal GCLK4 turns on a second transistor T2 so that the start signal Vst is charged into the first node Q through a first transistor T1 and the second transistor T2, during a first interval. Then, a sixth transistor T6 is turned on by the voltage on the first node Q. A fifth transistor T5 is also turned on by the start signal Vst so that the first supply voltage VSS is charged to the second node QB through the fifth transistor T5. The voltage VSS on the second node QB turns off third and seventh transistors T3 and T7. Accordingly, the sixth transistor T6 is turned on, thus the first gate line GL1 charges the first gate clock signal GCLK1 of a high level. As a result, an output signal of high level develops on the first gate line GL1 of the liquid crystal display panel (not shown).

The first gate clock signal GCLK1 continuously maintains the high level during a second interval. In accordance therewith, the status of the first stage T1 in the first interval continues for the second interval.

For a third interval, a second supply voltage VDD is charged to the second node QB through a fourth transistor T4 which is turned on by the third gate clock signal GCLK3. At this time, since the first gate clock signal GCLK1 has the low level, the first node Q maintains the previous voltage, i.e., the voltage of the start signal Vst. The voltage on the second node QB turns on the third and seventh transistors T3 and T7, thereby charging the first supply voltage VSS to both the first node Q and the first gate line GL1 of the liquid crystal display panel 130 through the third and seventh transistors T3 and T7.

Referring to FIG. 7, the timing controller in the present invention enables the first gate clock signal GCLK1 to simultaneously change into a high level together with the start signal Vst. In other words, the first gate clock signal GCLK has the same rising edge as the start signal Vst. Accordingly, the first gate clock signal GCLK1 has the high level interval equal to those of the second to fourth gate clock signals GCLK2 to GCLK4, and the first to fourth gate clock signals GCLK1 to GCLK4 are shifted from one another by a fixed period.

As described above, the liquid crystal display device, according to the embodiment of the present disclosure, makes the start signal Vst and the first gate clock signal GCLK1 equal to each other in the start time of high level interval, i.e., in the rising edge, thereby setting up the high level interval of the first gate clock signal GCLK1 to correspond to a period of two horizontal synchronous intervals. Accordingly, a precharging period of the first gate line GL1 is equal to those of the other gate lines GL2 to GLn, so that the brightness difference between the first gate line GL1 and the other gate lines GL2 to GLn can be improved. As a result, the liquid crystal display device can improve the quality of picture.

It will be apparent to those skilled in the art that various modifications and variations can be made in the present disclosure. Thus, it is intended that the present disclosure cover the modifications and variations of this embodiment provided they come within the scope of the appended claims and their equivalents.

What is claimed is:

1. A method of driving a liquid crystal display device comprising:
    deriving a frame detection signal from a data enable signal and a data clock signal;
    simultaneously deriving a start signal and a first gate clock signal from the frame detection signal and the data clock signal; and
    deriving a second gate clock signal from the first gate clock signal and the data clock signal,
    wherein the first gate clock signal is identical with the start signal in a start time point of high level interval.

2. The method claimed as in claim 1, wherein the high level interval of the first gate clock signal corresponds to a period of two horizontal synchronous intervals.

3. The method claimed as in claim 1, further comprising:
    deriving a third gate clock signal from the second gate clock signal and the data clock signal; and
    deriving a fourth gate clock signal from the third gate clock signal and the data clock signal.

4. A liquid crystal display device comprising:

a frame detector deriving a frame detection signal from a data enable signal and a data clock signal by detecting a blank interval between frames;

a start and first gate clock signal generator simultaneously deriving a start signal and a first gate clock signal from the frame detection signal and the data clock signal; and a second gate clock signal generator deriving a second gate signal from the first gate clock signal and the data clock signal, wherein the first gate clock signal is identical with the start signal in a start time point of high level interval.

5. The liquid crystal display device claimed as in claim 4, wherein the high level interval of the first gate clock signal corresponds to a period of two horizontal synchronous intervals.

6. The liquid crystal display device claimed as in claim 4, further comprising:

a third gate clock signal generator deriving a third gate clock signal from the second gate clock signal and the data clock signal; and a fourth gate clock signal generator deriving a fourth gate clock signal from the third gate clock signal and the data clock signal.

* * * * *